(12) United States Patent
Nakanishi et al.

(10) Patent No.: US 11,845,030 B2
(45) Date of Patent: Dec. 19, 2023

(54) METHOD FOR COLLECTING DUST FROM SINGLE CRYSTAL GROWTH SYSTEM AND DUST COLLECTING SYSTEM THEREOF

(71) Applicant: GlobalWafers Co., Ltd., Hsinchu (TW)

(72) Inventors: Masami Nakanishi, Hsinchu (TW); Yu-Sheng Su, Hsinchu (TW); I-Ching Li, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 806 days.

(21) Appl. No.: 16/907,313

(22) Filed: Jun. 22, 2020

(65) Prior Publication Data

US 2021/0394100 A1    Dec. 23, 2021

(51) Int. Cl.
*B01D 45/16* (2006.01)
*C30B 35/00* (2006.01)
(Continued)

(52) U.S. Cl.
CPC .......... *B01D 45/16* (2013.01); *B01D 53/145* (2013.01); *B01D 53/46* (2013.01); *B01D 53/76* (2013.01);
(Continued)

(58) Field of Classification Search
CPC ...... B01D 46/16; B01D 53/145; B01D 53/46; B01D 53/76; B01D 2252/103;
(Continued)

(56) References Cited

U.S. PATENT DOCUMENTS

| | | | | |
|---|---|---|---|---|
| 4,681,607 A | * | 7/1987 | Bollerhey | B01D 50/20 55/284 |
| 4,765,805 A | * | 8/1988 | Wahl | B01D 53/68 55/341.1 |

(Continued)

FOREIGN PATENT DOCUMENTS

| | | |
|---|---|---|
| CN | 1204956 C | 6/2005 |
| CN | 102029093 B | 8/2011 |

(Continued)

OTHER PUBLICATIONS

Translation of JP2010036054, accessed Jun. 14, 2023 (Year: 2010).*

*Primary Examiner* — Christopher P Jones
*Assistant Examiner* — Phillip Y Shao
(74) *Attorney, Agent, or Firm* — Li & Cai Intellectual Property Office

(57) ABSTRACT

A dust collecting system for single crystal growth system includes an air compressor, a dust collecting device, a first inert gas source, a rotary pump and a scrubber. The air compressor is fluidly connected to an exit pipe of the single crystal growth system. The exit pipe is used to exhaust unstable dust from the single crystal growth system. The dust collecting device is fluidly connecting to the exit pipe to collect the dust oxide. The first inert gas source is fluidly connected to the exit pipe to blow a first inert gas into the exit pipe to compel the dust oxide toward the dust collecting device. The rotary pump is fluidly connected to the dust collecting device. The scrubber is fluidly connected to the rotary pump. The rotary pump transports the residual dust (Continued)

oxide toward the scrubber. The present disclosure further provides a method for collecting dust.

6 Claims, 1 Drawing Sheet

(51) Int. Cl.
| | |
|---|---|
| *B01D 53/14* | (2006.01) |
| *B01D 53/76* | (2006.01) |
| *B04C 5/185* | (2006.01) |
| *B04C 9/00* | (2006.01) |
| *B01D 53/46* | (2006.01) |

(52) U.S. Cl.
CPC ............... *B04C 5/185* (2013.01); *B04C 9/00* (2013.01); *C30B 35/00* (2013.01); *B01D 2252/103* (2013.01); *B04C 2009/005* (2013.01)

(58) Field of Classification Search
CPC .... B01D 45/12; B01D 47/06; B01D 46/0042; B04C 5/185; B04C 9/00; B04C 2009/005; B04C 2009/008; C30B 35/00
See application file for complete search history.

(56) References Cited

U.S. PATENT DOCUMENTS

| | | | | |
|---|---|---|---|---|
| 5,151,395 | A * | 9/1992 | Tom | F17C 13/084 |
| | | | | 502/67 |
| 5,489,166 | A * | 2/1996 | Schmit | C21B 7/22 |
| | | | | 406/137 |
| 6,189,176 | B1* | 2/2001 | Ivey | C30B 15/00 |
| | | | | 15/316.1 |
| 6,759,018 | B1* | 7/2004 | Arno | B01J 4/001 |
| | | | | 261/21 |
| 8,486,171 | B2 | 7/2013 | Nanjing et al. | |
| 2008/0004576 | A1* | 1/2008 | Tanaka | A61F 5/451 |
| | | | | 604/326 |
| 2009/0214992 | A1* | 8/2009 | McKnight | F03G 7/0254 |
| | | | | 110/263 |
| 2010/0050393 | A1* | 3/2010 | Clark | H01L 31/18 |
| | | | | 23/300 |

FOREIGN PATENT DOCUMENTS

| | | |
|---|---|---|
| JP | 201036054 A | 2/2010 |
| TW | 478961 B | 3/2002 |
| WO | WO2006098581 A1 | 9/2006 |

* cited by examiner

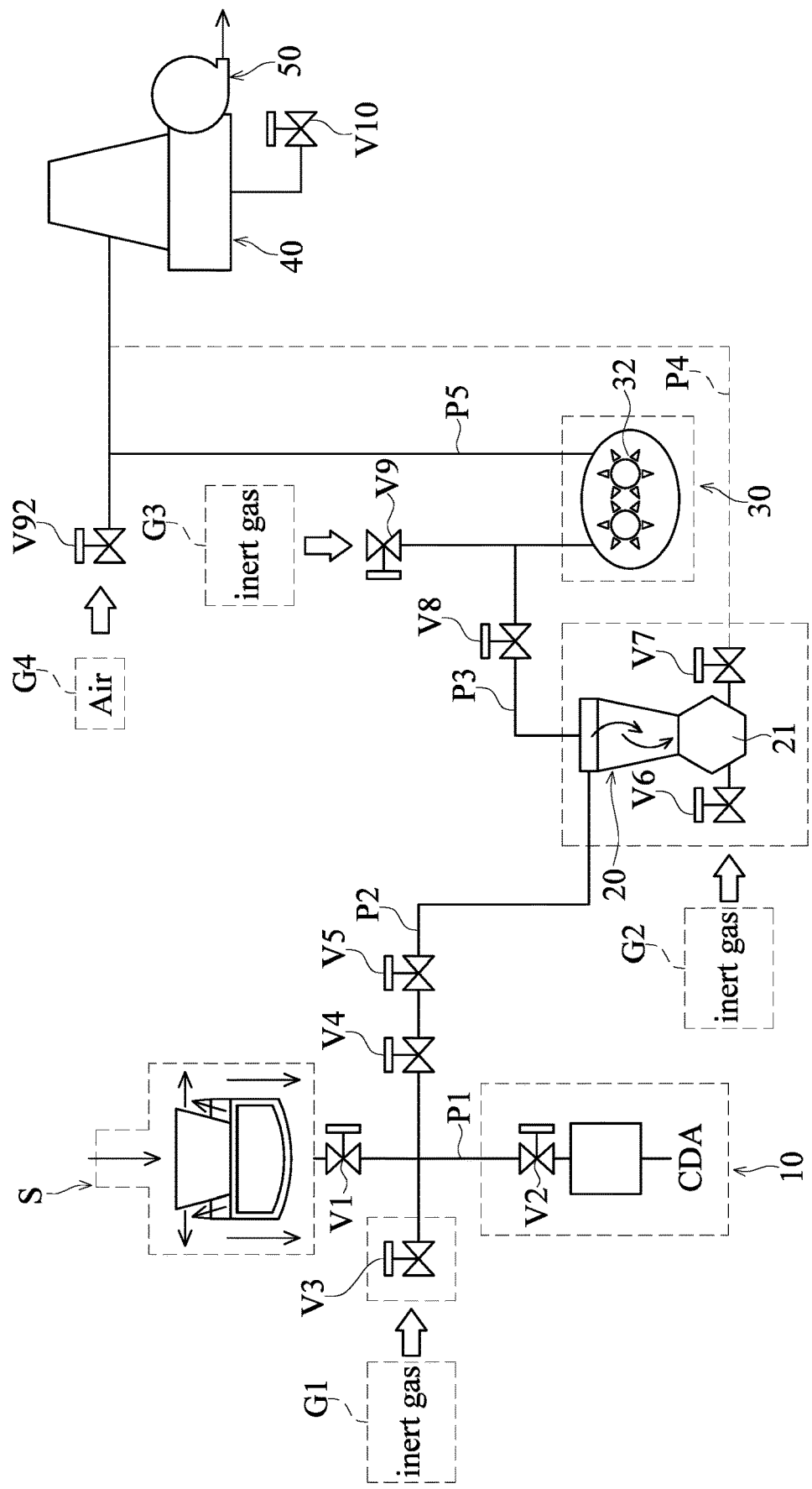

METHOD FOR COLLECTING DUST FROM SINGLE CRYSTAL GROWTH SYSTEM AND DUST COLLECTING SYSTEM THEREOF

FIELD OF THE DISCLOSURE

The present disclosure relates to a method for collecting dust and a dust collecting system, and more particularly to a method for collecting dust or particles from a single crystal growth system and a dust collecting system thereof.

BACKGROUND OF THE DISCLOSURE

A cyclone dust collecting device is a device for applying to collect dust or particles in gas by centrifugal force, such as a related art of Japan Patent Publication No. JP2010-036054. Although the cyclone dust collecting device may reduce the number of required filters, the pipe used to transport gas containing dust or particles still has problems that dust is deposited on an inner surface of the pipe. To remove the deposited dust, manual labor is necessitated, and the potential hazard of removing dust may occur.

SUMMARY OF THE DISCLOSURE

In response to the above-referenced technical inadequacies, the present disclosure provides a method for collecting dust from a single crystal growth system and a dust collecting system for a single crystal growth system.

In one aspect, the present disclosure provides a method for collecting dust from a single crystal growth system, including steps as follows: providing clean dry air and oxygen into an exit pipe connecting to the single crystal growth system, the oxygen reacting with the unstable dust for forming dust oxide so as to stabilize the dust in the exit pipe, wherein the exit pipe is used to exhaust unstable dust from the single crystal growth system; blowing a first inert gas into the exit pipe to compel the dust oxide toward a dust collecting device; collecting the dust oxide by the dust collecting device; and providing a rotary pump to transport residues of the dust oxide backward.

In certain embodiments, further providing an air compressor with a steam separator fluidly connected to the exit pipe to provide clean dry air into the exit pipe, a first valve is connected between the single crystal growth system and the exit pipe, and a second valve is connected between the air compressor and the exit pipe.

In another aspect, the present disclosure provides a dust collecting system for a single crystal growth system which includes an air compressor, a dust collecting device, a first inert gas source, a rotary pump, and a scrubber. The air compressor is fluidly connected to an exit pipe of the single crystal growth system. The exit pipe is used to exhaust unstable dust from the single crystal growth system. The dust collecting device is fluidly connected to the exit pipe to collect the dust oxide. The first inert gas source is fluidly connected to the exit pipe to blow a first inert gas into the exit pipe to compel the dust oxide toward the dust collecting device. The rotary pump is fluidly connected to the dust collecting device. The scrubber is fluidly connected to the rotary pump by a transport pipe. The rotary pump transports residues of the dust oxide backward.

In certain embodiments according to the present disclosure, the air compressor provides clean dry air into the exit pipe, a first valve is connected between the single crystal growth system and the exit pipe, and a second valve is connected between the air compressor and the exit pipe.

In certain embodiments according to the present disclosure, the first inert gas is nitrogen, and a first airflow valve is connected to the exit pipe to control an airflow of the first inert gas.

In certain embodiments according to the present disclosure, an exhaust pipe is connected between the exit pipe and the dust collecting device, a line valve is connected between the exit pipe and a dust collecting device, and a throttle valve is connected between the line valve and the dust collecting device.

In certain embodiments according to the present disclosure, the dust collecting device is a cyclone filter, a collecting area of the cyclone filter is fluidly connected to the scrubber, and a second inert gas source connects to the collecting area of the cyclone filter for blowing a second inert gas into the collecting area of the cyclone filter.

In certain embodiments according to the present disclosure, the dust collecting system further includes a second airflow valve connecting to the collecting area of the cyclone filter to control an airflow of the second inert gas, and a second stop valve being connected between the collecting area of the cyclone filter and the scrubber.

In certain embodiments according to the present disclosure, the dust collecting system further includes a third inert gas source for blowing a third inert gas into the rotary pump to clean a rotator of the rotary pump.

In certain embodiments according to the present disclosure, the dust collecting system further includes a third stop valve and a third airflow valve, wherein the third stop valve is connected between the cyclone filter and the rotary pump, and the third airflow valve is connected between the third stop valve and the rotary pump to control an airflow of the third inert gas.

Further, a critical point is that this system has an oxide powder transport function to the scrubber. In order to transport oxide powder, the system needs an air intake point which is located at the end of the transport pipe from the scrubber.

In certain embodiments according to the present disclosure, the dust collecting system further includes a fourth inert gas source provided for blowing an inert gas into the pipe connected the scrubber, and a valve is connected between the rotary pump and the scrubber.

Therefore, the present disclosure can first stabilize the dust in the exit pipe for avoiding potential dangers, and then provide inert gas so that the dust is not deposited on an inner surface of the exit pipe. In addition, the present disclosure can reduce the labor required to remove the dust oxide out of the cyclone filter, and avoid potential hazards when removing dust.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 1 is a perspective view of a dust collecting system for a single crystal growth system according to the present disclosure.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, an exemplary embodiment of the present disclosure provides a dust collecting system for a single crystal growth system, which includes an air compressor 10, a dust collecting device 20, a rotary pump 30, and a scrubber 40. The air compressor 10 is fluidly connected to an exit pipe P1 of the single crystal growth system S. The exit pipe P1 is used to exhaust unstable dust from the single crystal growth system S. The dust collecting device 20 is fluidly connected to the exit pipe P1 to collect the dust oxide. In this embodiment, "dust" refers to fine particles of solid matter.

In this embodiment, the air compressor 10 provides clean dry air (CDA) into the exit pipe P1. The air compressor 10 includes a steam separator for separating water droplets from steam. A first valve V1 is connected between the single crystal growth system S and the exit pipe P1 for controlling the exhausting of the dust. A second valve V2 is connected between the air compressor 10 and the exit pipe P1. The clean dry air from the air compressor 10 not only is used to remove moisture out of the exit pipe P1, and but also provides oxygen into the exit pipe P1 to react with the unstable dust for forming dust oxide so as to stabilize the dust in the exit pipe P1. In a certain case, the dust may be unstable, such as phosphorus or combustible dust, which may cause a dust explosion upon reaching a dangerous concentration level. This embodiment is especially suitable for the processes incorporated with phosphorus. First, an oxygenation process is used to oxidize the phosphorus as phosphorous oxides by providing clean dry air, so as to prevent moisture in air from acting with phosphorus to form phosphates product.

In this embodiment, the dry ranges of the clean dry air are defined according to dew point temperature and moisture, and the reference ranges are listed in the below table.

| Range | Range 1 | Range 2 | Range 3 |
| --- | --- | --- | --- |
| Dew point temperature (° C.) | −56.9 to −59.3 | −53 to −54.7 | −53 to −60 |
| Moisture (g/cm3) | 0.0017 to 0.0010 | 0.0028 to 0.0022 | 0.0028 to 0.0010 |

The present disclosure provides a first inert gas source G1, which is fluidly connected to the exit pipe P1 to blow a first inert gas into the exit pipe P1 to compel the dust oxide toward the dust collecting device 20. In this embodiment, the first inert gas can be nitrogen ($N_2$) or argon (Ar), but it is not limited thereto. A first airflow valve V3 is connected to the exit pipe P1 to control an airflow of the first inert gas. The advantage of providing the inert gas is that the dust is not deposited on an inner surface of the exit pipe P1.

In this embodiment, an exhaust pipe P2 is used to connect the exit pipe P1 with the dust collecting device 20. A line valve V4 is connected between the exit pipe P1 and the dust collecting device 20, and a throttle valve V5 is connected between the line valve V4 and the dust collecting device 20. The line valve V4 is used to close the exhaust pipe P2, when the air compressor 10 is providing clean dry air with oxygen into the exit pipe P1. The throttle valve V5 can be used to adjust the pressure in the exhaust pipe P2.

In this embodiment, the dust collecting device 20 is a cyclone filter. The cyclone filter can remove dust or particles. The cyclone filter is a centrifugal separator in which particles, due to their mass, are pushed to the outer edges as a result of centrifugal force. Incoming air is automatically forced to adopt a fast-revolving spiral movement, called a "double vortex". This double spiral movement includes an outer stream, which flows downwards in a spiral, and an inner stream, which flows upwards in a spiral. At the interchange between both streams, air passes from one stream to the other. The particles which are present in the air are forced to the outer edges and leave the separator via a collection device fitted to the bottom of the separator. A collecting area (21) of the cyclone filter (20) is fluidly connected to the scrubber 40.

In this embodiment, a second inert gas source G2 connects to the collecting area (21) of the cyclone filter (20) for blowing a second inert gas into the collecting area (21) of the cyclone filter (20) for collecting dust oxide. If some dust oxide is not collected by the cyclone filter (20), the residual dust oxide can be collected to the scrubber 40 through a pipe P4. In this embodiment, the second inert gas is nitrogen, but it is not limited thereto. Such an arrangement can reduce the labor required to remove the dust oxide out of the cyclone filter (20), and avoid any potential hazards in removing dust. In this embodiment, a second airflow valve V6 is connected to the collecting area (21) of the cyclone filter (20) to control an airflow of the second inert gas. In addition, a second stop valve V7 is connected between the collecting area (21) of the cyclone filter (20) and the scrubber 40, which can be used to control a pipe P4 connected between the cyclone filter (20) and the scrubber 40.

The rotary pump 30 is fluidly connected to the dust collecting device 20. The rotary pump 30 is a positive-displacement (PD) pump that uses one or several screws to move fluids along the screw(s) axis. The rotary pump 30 can be a dry rotary pump. In this embodiment, a third pipe P3 is connected between the rotary pump 30 and the dust collecting device 20. In other words, an outlet of the dust collecting device 20 is connected to an inlet of the rotary pump 30. An outlet of the rotary pump 30 is connected to the scrubber 40. In this embodiment, a transport pipe P5 connects the rotary pump 30 to the scrubber 40. The rotary pump 30 transports residues of the dust oxide toward the scrubber 40. A characteristic of the present disclosure is that the rotary pump 30 is preferably a dry rotary pump, and a third inert gas source G3 is provided for blowing a third inert gas into the rotary pump 30 to clean a rotator 32 of the rotary pump 30. In this embodiment, the third inert gas is nitrogen, but it is not limited thereto. By this arrangement, the present disclosure can automatically clean the rotator 32 of the rotary pump 30 without labor power.

To control the airflow of the third inert gas, this embodiment further includes a third stop valve V8 and a third airflow valve V9. The third stop valve V8 is connected between the cyclone filter (20) and the rotary pump 30. The third airflow valve V9 is connected between the third stop valve V8 and the rotary pump 30 to control the airflow of the third inert gas.

A critical point is that this system has an oxide powder transport function to the scrubber 40. In order to transport oxide powder, the system needs an air intake point which is located at the end of the transport pipe P5 from the scrubber 40. Specifically, an air source G4 is provided for blowing air into the transport pipe P5 connected to the scrubber 40. A valve V92 can be applied to control the air source G4. The valve V92 is connected between the rotary pump 30 and the scrubber 40 to control air into the scrubber 40.

The scrubber 40 is fluidly connected to the rotary pump 30. Specifically, the scrubber is also known as wet scrubbers, or dust collectors, that use liquid. In the scrubber 40, the scrubbing liquid (usually water) comes into contact with a gas stream containing dust particles. In this embodiment, the scrubber 40 has a blower 50, which can provide a force to transport the dust. A drain valve V10 is connected to an outlet of the scrubber 40 to control an exit of the collected dust oxide.

The present disclosure further provides a method for collecting dust from a single crystal growth system according to the dust collecting system. First, a step is executed for removing moisture out of the exit pipe P1 connecting to the single crystal growth system. A second step is executed for providing oxygen into the exit pipe P1 to react with the unstable dust for forming dust oxide so as to stabilize the dust in the exit pipe P1. A third step is executed for blowing a first inert gas into the exit pipe P1 to compel the dust oxide toward the dust collecting device 20. A fourth step is executed for collecting the dust oxide by the dust collecting device. Finally, a step is executed in which a rotary pump is provided to transport residues of the dust oxide toward a scrubber.

Preferably, a second inert gas blows into the collecting area of the cyclone filter to compel the collected dust oxide to the scrubber. In addition, the method further includes a step of blowing a third inert gas into the rotary pump 30 to clean the rotator 32 of the rotary pump 30.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A dust collecting system for a single crystal growth system, comprising:
   an air compressor fluidly connected to an exit pipe of the single crystal growth system, wherein the exit pipe is used to exhaust unstable dust from the single crystal growth system, wherein the air compressor provides clean dry air into the exit pipe, the air compressor includes a steam separator for separating water droplets from steam, the clean dry air from the air compressor is used to remove moisture out of the exit pipe, and provides oxygen into the exit pipe to react with unstable dust for forming dust oxide so as to stabilize the dust in the exit pipe;
   a dust collecting device fluidly connected to the exit pipe to collect the dust oxide;
   a first inert gas source fluidly connected to the exit pipe to blow a first inert gas into the exit pipe to compel the dust oxide toward the dust collecting device;
   a rotary pump fluidly connected to the dust collecting device; and
   a scrubber fluidly connected to the rotary pump, wherein the rotary pump transports residues of the dust oxide toward the scrubber via a third pipe connected between the rotary pump and the dust collecting device, and a transport pipe connected between the rotary pump and the scrubber;
   wherein the dust collecting device is a cyclone filter, the cyclone filter has a collecting area at a bottom thereof, the collecting area is fluidly connected with the scrubber and is used to collect the dust oxide, and a second inert gas source connects to the collecting area of the cyclone filter for blowing a second inert gas into the collecting area of the cyclone filter to compel the collected dust oxide to the scrubber through a pipe connected between the collecting area of the cyclone filter and the scrubber;
   a second airflow valve connecting to the collecting area of the cyclone filter to control an airflow of the second inert gas, and a second stop valve being connected between the collecting area of the cyclone filter and the scrubber; and
   a third inert gas source for blowing a third inert gas into the rotary pump to clean a rotator of the rotary pump.

2. The dust collecting system as claimed in claim 1, wherein a first valve is connected between the single crystal growth system and the exit pipe, and a second valve is connected between the air compressor and the exit pipe.

3. The dust collecting system as claimed in claim 1, wherein the first inert gas is nitrogen, and a first airflow valve is connected to the exit pipe to control an airflow of the first inert gas.

4. The dust collecting system as claimed in claim 1, wherein an exhaust pipe is connected between the exit pipe and the dust collecting device, a line valve is connected between the exit pipe and a dust collecting device, and a throttle valve is connected between the line valve and the dust collecting device.

5. The dust collecting system as claimed in claim 1, further comprising a third stop valve and a third airflow valve, wherein the third stop valve is connected between the cyclone filter and the rotary pump, and the third airflow valve is connected between the third stop valve and the rotary pump to control an airflow of the third inert gas.

6. The dust collecting system as claimed in claim 5, further comprising a fourth inert gas source for blowing an inert gas into a transport pipe connected the scrubber, and a valve being connected between the rotary pump and the scrubber.

* * * * *